United States Patent
Ichinose

(10) Patent No.: US 12,318,863 B2
(45) Date of Patent: Jun. 3, 2025

(54) ULTRASONIC JOINING APPARATUS

(71) Applicant: TOSHIBA MITSUBISHI-ELECTRIC INDUSTRIAL SYSTEMS CORPORATION, Tokyo (JP)

(72) Inventor: Akihiro Ichinose, Tokyo (JP)

(73) Assignee: TMEIC CORPORATION, Tokyo (JP)

( * ) Notice: Subject to any disclaimer, the term of this patent is extended or adjusted under 35 U.S.C. 154(b) by 0 days.

(21) Appl. No.: 18/271,471

(22) PCT Filed: Dec. 1, 2021

(86) PCT No.: PCT/JP2021/044098
§ 371 (c)(1),
(2) Date: Jul. 10, 2023

(87) PCT Pub. No.: WO2023/100288
PCT Pub. Date: Jun. 8, 2023

(65) Prior Publication Data
US 2024/0051063 A1    Feb. 15, 2024

(51) Int. Cl.
*B23K 20/00* (2006.01)
*B23K 20/10* (2006.01)
(Continued)

(52) U.S. Cl.
CPC ............ *B23K 20/26* (2013.01); *B23K 20/004* (2013.01); *B23K 20/10* (2013.01); *B23K 2101/32* (2018.08)

(58) Field of Classification Search
CPC .............. B23K 20/26; B23K 20/004; B23K 20/10–106; B23K 2101/32;
(Continued)

(56) References Cited

U.S. PATENT DOCUMENTS 5,248,104 A * 9/1993 Groos ................ B65H 59/36
242/420.6
2002/0096553 A1* 7/2002 Copperthite ......... B23K 20/004
228/103

(Continued)

FOREIGN PATENT DOCUMENTS

CN 106141414 A * 11/2016
CN 112047199 A * 12/2020 ............. B65H 59/36

(Continued)

OTHER PUBLICATIONS

International Search Report and Written Opinion mailed on Feb. 8, 2022, received for PCT Application PCT/JP2021/044098, filed on Dec. 1, 2021, 8 pages including English Translation.

(Continued)

*Primary Examiner* — Kiley S Stoner
(74) *Attorney, Agent, or Firm* — XSENSUS LLP

(57) ABSTRACT

In an ultrasonic joining apparatus according to the present disclosure, an ultrasonic joining apparatus control board controls an operation of a lead set unit and a tension adjustment unit including a dancer roller to perform joining tension control processing. The joining tension control processing includes steps of: making a lead wire housing mechanism perform a rewinding driving of rewinding a lead wire in a lead cassette when the dancer roller reaches a lower limit adjustment position in a tension adjustment range; and making the lead wire housing mechanism perform a delivery driving of sending out the lead wire from the lead cassette when the dancer roller reaches an upper limit adjustment position in the tension adjustment range.

6 Claims, 13 Drawing Sheets

(51) Int. Cl.
*B23K 20/26* (2006.01)
*B23K 101/32* (2006.01)

(58) Field of Classification Search
CPC .. B23K 2101/38; B23K 2101/42; B23K 1/06; B23K 20/005; B23K 20/007; B65H 59/36; B65H 59/38; H01L 24/745
USPC .............. 228/110.1, 1.1, 180.5, 4.5, 904
See application file for complete search history.

(56) References Cited

U.S. PATENT DOCUMENTS

| 2005/0087585 | A1* | 4/2005 | Copperthite | ............ | H01L 24/78 228/180.5 |
| 2022/0002112 | A1 | 1/2022 | Ichinose et al. | | |

FOREIGN PATENT DOCUMENTS

| GB | 2104555 A | * | 3/1983 | ............. B65H 59/22 |
| JP | H03-128848 A | | 5/1991 | |
| JP | 2005056899 A | * | 3/2005 | ........... H01L 24/745 |
| JP | 6827688 B1 | | 2/2021 | |
| KR | 102271339 B1 | * | 6/2021 | |
| NL | 2004379 A | * | 9/2010 | |
| WO | WO-2008057091 A1 | * | 5/2008 | ........... B23K 20/004 |
| WO | 2012/073318 A1 | | 6/2012 | |
| WO | WO-2016117140 A1 | * | 7/2016 | ............... B23H 7/00 |
| WO | 2021/019705 A1 | | 2/2021 | |

OTHER PUBLICATIONS

Extended European search report issued on Aug. 7, 2024, in corresponding European patent Application No. 21966372.1, 8 pages.

* cited by examiner

ULTRASONIC JOINING APPARATUS

CROSS-REFERENCE TO RELATED APPLICATION

The present application is based on PCT filing PCT/JP2021/044098, filed Dec. 1, 2021, the entire contents of which are incorporated herein by reference.

TECHNICAL FIELD

The present disclosure relates to an ultrasonic joining apparatus in which a lead wire is ultrasonic-joined on a substrate.

BACKGROUND ART

In a conventional ultrasonic joining apparatus, a lead wire is disposed in a lead set position on a substrate, and ultrasonic joining processing is performed on the lead wire on the substrate using a ultrasonic joining head, thereby joining the lead wire to the substrate.

The conventional ultrasonic joining apparatus is used for a full automatic manufacturing line, for example, and performs the ultrasonic joining processing to join the lead wire (electrode wire) to an electrode film surface of the substrate. For example, an aluminum wire or a copper wire having a band-like shape and a material thickness of 0.1 mm is used as the lead wire. Such an ultrasonic joining apparatus generally has a tension adjustment function for adjusting tension on the lead wire.

Examples of components of the ultrasonic joining apparatus having the tension adjustment function include a lead wire drawing apparatus disclosed in Patent Document 1 and a lead wire drawing apparatus disclosed in Patent Document 2.

PRIOR ART DOCUMENTS

Patent Document(s)

Patent Document 1: International Publication No. 2012/73318
Patent Document 2: Japanese Patent No. 6827688

SUMMARY

Problem to be Solved by the Invention

However, the tension adjustment function achieved by the conventional lead wire drawing apparatus, for example, cannot perform tension adjustment fit to a drawing operation of the lead wire or an actual operation contents of the ultrasonic joining processing.

Thus, the conventional ultrasonic joining apparatus has a problem that the lead wire cannot be accurately joined to the substrate.

The present disclosure is to solve the above problem, and an object of the present disclosure is to provide an ultrasonic joining apparatus capable of accurately joining a lead wire to a substrate.

Means to Solve the Problem

An ultrasonic joining apparatus according to the present disclosure includes: a lead wire housing mechanism housing a lead wire so as to be able to draw the lead wire from a tip end portion; a tension adjustment mechanism pressed down with predetermined welding pressure, having a dancer roller which can be moved up and down, and keeping a contact relationship between the dancer roller and the lead wire, thereby performing tension adjustment processing of adjusting tension on the lead wire; an ultrasonic joining head performing ultrasonic joining processing on the lead wire disposed on a substrate to join the lead wire to the substrate; and a controller controlling the ultrasonic joining head, the lead wire housing mechanism, and the tension adjustment mechanism, wherein the lead wire housing mechanism can perform a delivery driving of sending out the lead wire and a rewinding driving of rewinding the lead wire, the tension adjustment mechanism can be set to any of a preparatory state and an actual operation state, the preparatory state is a state where the dancer roller is disposed in a position where the tension adjustment processing cannot be performed, and the actual operation state is a state where the dancer roller is disposed in a position where the tension adjustment processing can be performed, the controller controls the lead wire housing mechanism and the tension adjustment mechanism to perform tension control processing of controlling tension on the lead wire, the tension control processing includes joining tension control processing performed in the ultrasonic joining processing, and a tension adjustment range in an up-down direction and an upper limit adjustment position and a lower limit adjustment position in the tension adjustment range are previously set, and the joining tension control processing includes steps of: (a) setting the tension adjustment mechanism to the actual operation state to locate the dancer roller in the tension adjustment range; (b) making the lead wire housing mechanism perform the rewinding driving so that the dancer roller is located within the tension adjustment range when the dancer roller reaches the lower limit adjustment position; and (c) making the lead wire housing mechanism perform the delivery driving so that the dancer roller is located within the tension adjustment range when the dancer roller reaches the upper limit adjustment position.

Effects of the Invention

The ultrasonic joining apparatus according to the present disclosure performs the joining tension control processing including steps (a) to (c) described above under control of the controller, thus the dancer roller is stably disposed in the tension adjustment range during a period of performing the ultrasonic joining processing.

The tension adjustment range is previously set in a range where fluctuation of the predetermined welding pressure given to the dancer roller is relatively small, thus tension on the lead wire can be stably maintained within a constant tension range during the period of performing the ultrasonic joining processing.

As a result, the ultrasonic joining apparatus according to the present disclosure can perform the ultrasonic joining processing of accurately joining the lead wire to the substrate.

These and other objects, features, aspects and advantages of the present disclosure will become more apparent from the following detailed description of the present disclosure when taken in conjunction with the accompanying drawings.

DESCRIPTION OF EMBODIMENT (S)

Embodiment (Whole Configuration and Basic Operation)

Figure 1:
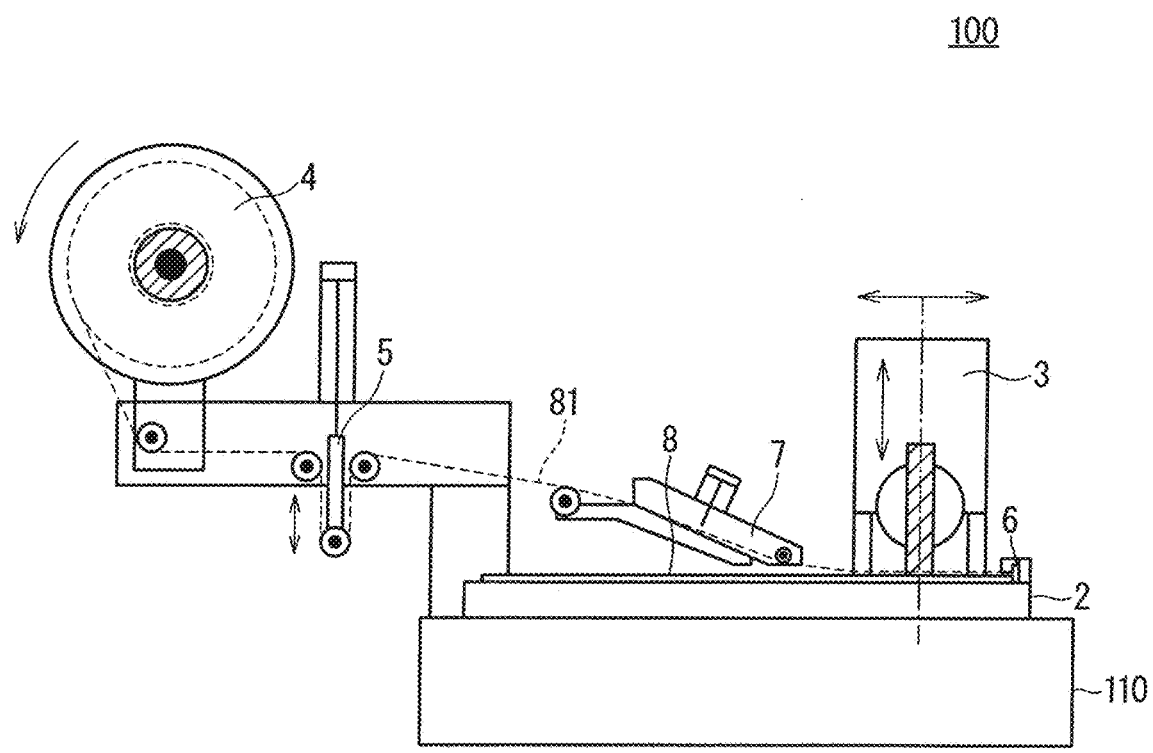
FIG. 1 An explanation diagram schematically illustrating a whole configuration of an ultrasonic joining apparatus according to an embodiment.
Figure 2:
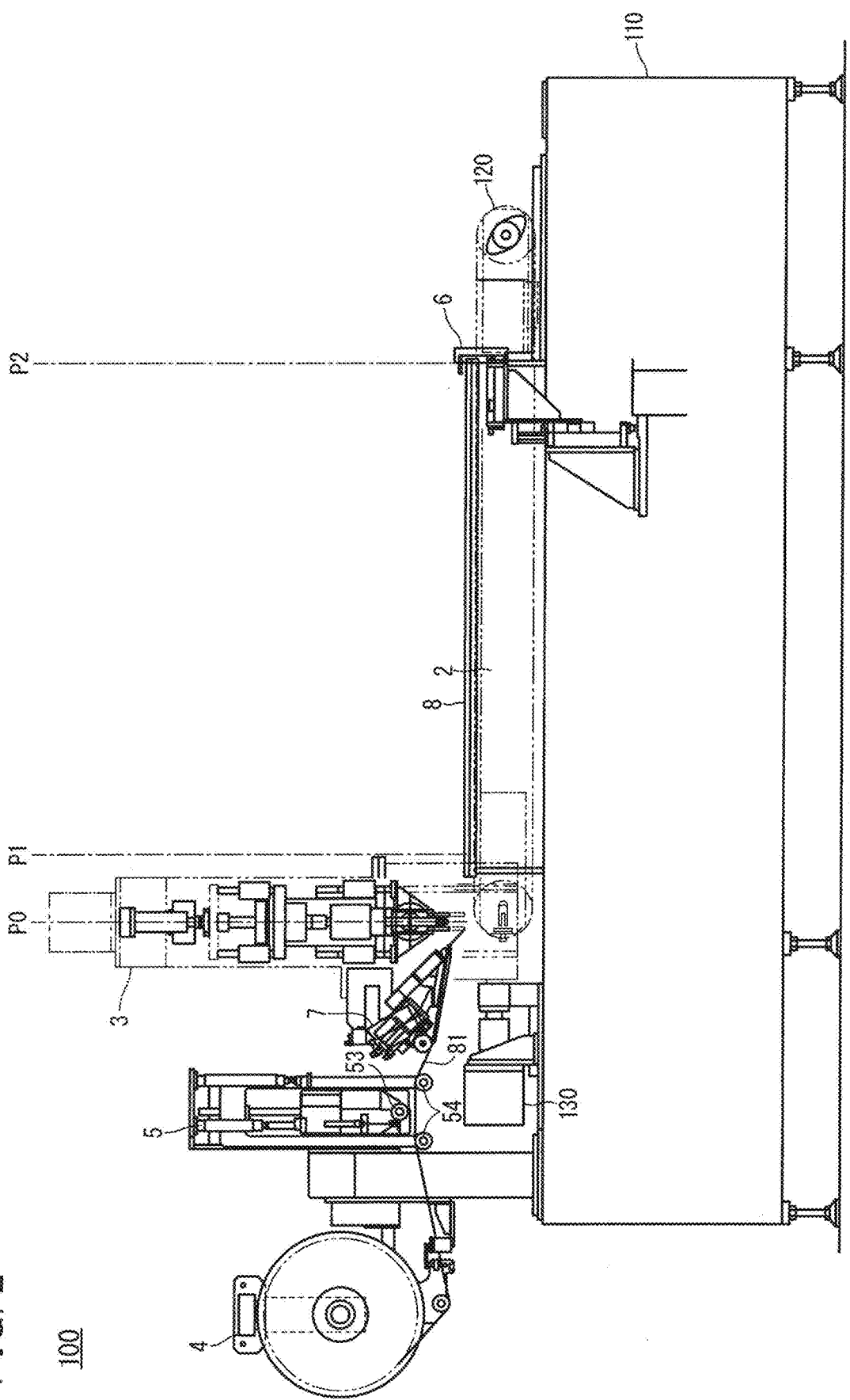
FIG. 2 An explanation diagram illustrating an origin point standby state of the ultrasonic joining apparatus.
Figure 3:
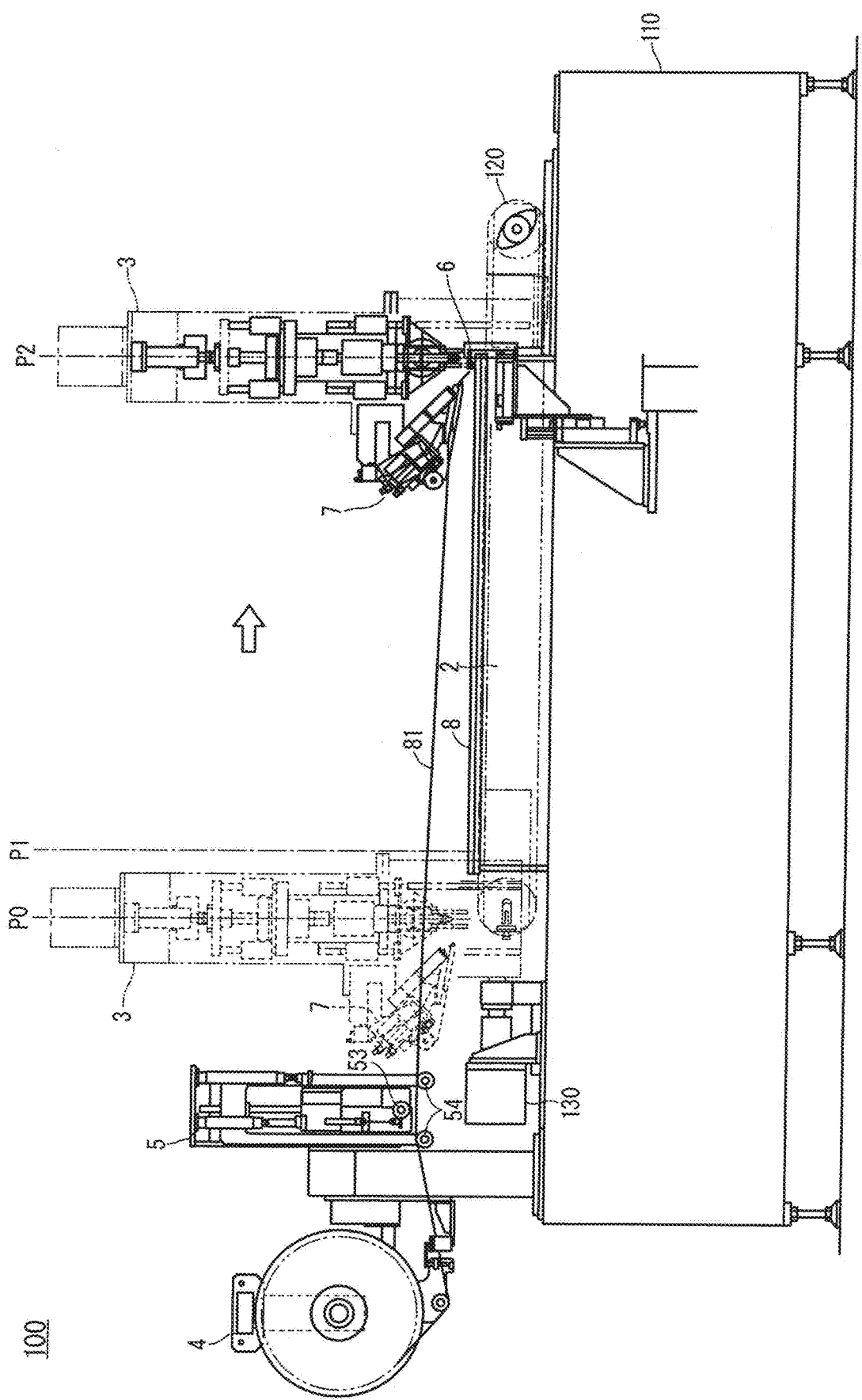
FIG. 3 An explanation diagram illustrating a lead clamp position state of the ultrasonic joining apparatus.
Figure 4:
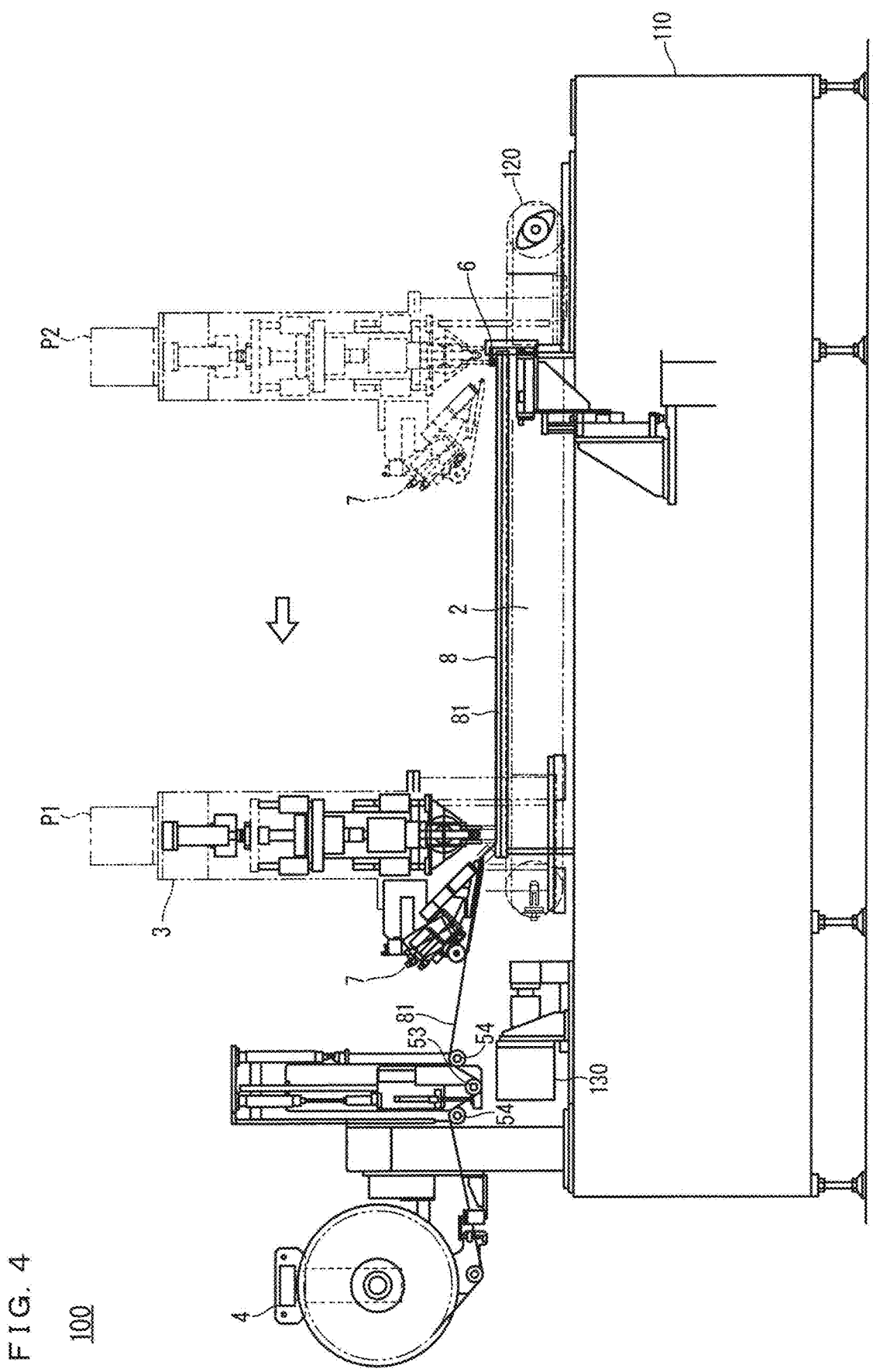
FIG. 4 An explanation diagram illustrating a lead cut position state of the ultrasonic joining apparatus.

FIG. 1 to FIG. 4 are explanation diagrams each illustrating a whole configuration and a basic operation of an ultrasonic joining apparatus 100 according to an embodiment of the present disclosure. FIG. 1 is an explanation diagram schematically illustrating a whole configuration of the ultrasonic joining apparatus 100. In the meanwhile, FIG. 2 illustrates an origin point standby state, FIG. 3 is a lead clamp position state, and FIG. 4 is a lead cut position state.

As illustrated in FIG. 1 to FIG. 4, the ultrasonic joining apparatus 100 includes a joining table 2, a joining head unit 3, a lead set unit 4, a tension adjustment unit 5, a lead clamp unit 6, a lead wire grasping unit 7, a glass substrate 8, a base table 110, a transportation conveyer 120, and a drive motor 130 as main constituent elements. Each constituent element is schematically illustrated, thus does not necessarily coincide with an actual structure. Structures of the lead set unit 4 and the tension adjustment unit 5 as a feature parts of the ultrasonic joining apparatus 100 are described in detail hereinafter.

The joining table 2, the lead set unit 4, the tension adjustment unit 5, the lead clamp unit 6, the transportation conveyer 120, and the drive motor 130 are attached to the base table 110.

A lead wire 81 is wound around a predetermined support shaft as a central axis in a lead cassette 40 descried hereinafter of the lead set unit 4, and a tip end portion of the lead wire 81 is exposed outside, and the tip end portion of the lead wire 81 can be drawn from outside.

That is to say, the lead set unit 4 is a stacked unit in which the lead wire 81 is wound around the support shaft in multiple layers. The lead set unit 4 rotates the support shaft using a drive motor 41 described hereinafter, thus a delivery driving of the lead wire 81 and a rewinding driving of the lead wire 81.

In this manner, the lead set unit 4 has a tension lead function of generating constant tension on the lead wire 81 by appropriately performing the delivery driving and the rewinding driving so that tension on the lead wire 81 becomes appropriate tension, Accordingly, a phenomenon that the lead wire 81 wound around the support shaft of the lead set unit 4 is loosened and drops out of a predetermined guide range does not occur.

The transportation conveyer 120 is used to transport the glass substrate 8 onto the joining table 2. A glass substrate used for a solar battery, for example, is considered as the glass substrate 8. The joining table 2 has a configuration made up of three pieces (regions) of a first end portion, a center portion, and a second end portion separated from each other when viewed from an upper side. In the transportation conveyer 120, a belt for transporting the glass substrate 8 is provided between the first end portion and the center portion and between the center portion and the second end portion.

The belt of the transportation conveyer 120 is set in a higher position than the joining table 2 in transportation of the glass substrate 8, and is moved to a lower side of the joining table 2 after transporting the glass substrate 8 to an upper side of the joining table 2. In this manner, the glass substrate 8 can be disposed on the joining table 2 by the transportation conveyer 120.

After the glass substrate 8 is transported, the belt of the transportation conveyer 120 is housed in the lower side of the joining table 2, thus the transportation conveyer 120 does not have influence on the ultrasonic joining processing performed on the lead wire 81 on the glass substrate 8.

As illustrated in FIG. 2, in an origin point standby state where the joining head unit 3 is located in an origin position P0 (before the lead setting), the lead wire 81 drawn out of the lead set unit 4 is passed in the tension adjustment unit 5, and then grasped in the lead wire grasping unit 7 having a function of cutting the lead wire. The sequential processing performed on the lead wire 81 is manually performed by an operator. In the origin point standby state, a pair of fixing rollers 54 have contact with the lead wire 81, and a dancer roller 53 has no contact relationship with the lead wire 81 in the tension adjustment unit 5.

The lead wire grasping unit 7 also performs guide processing on the lead wire 81 to guide the lead wire 81 in a guide direction. The guide processing by the lead wire grasping unit 7 on the lead wire 81 is always performed.

As illustrated in FIG. 3, the joining head unit 3 is moved from the origin position P0 to a lead clamp position P2, thereby entering the lead clamp position state. The lead wire grasping unit 7 is also moved while grasping the lead wire 81 along with the movement of the joining head unit 3. The movement processing on the joining head unit 3 and the lead wire grasping unit 7 is performed by the drive motor 130 as a drive source.

A part of the lead wire 81 is fixed in a lead set position on the glass substrate 8 by the lead clamp unit 6, thus the lead set operation is completed. In performing the lead set operation, the pair of fixing rollers 54 have contact with the lead wire 81, and the dancer roller 53 has no contact relationship with the lead wire 81 in the tension adjustment unit 5.

The lead clamp unit 6 temporarily fixes a tip end of the lead wire 81 disposed on the joining table 2 at the lead set position on the glass substrate 8. The temporal fixation of the lead wire 81 by the lead clamp unit 6 is released after the ultrasonic joining processing of the joining head unit 3 is finished.

Previous tension control processing described hereinafter is performed during a period of performing the lead set operation under control of an ultrasonic joining apparatus control board 20 described in detail hereinafter.

After the lead set operation is completed, the lead wire grasping unit 7 releases the lead wire 81 from a grasp state. After the joining head unit 3 is moved to a joining position, the ultrasonic joining processing is performed by an ultrasonic joining head of the joining head unit 3 on the lead wire 81 disposed on the glass substrate 8. As a result, the lead wire 81 is joined on the glass substrate 8.

In this manner, the joining head unit 3 performs the ultrasonic joining processing by the ultrasonic joining head on the lead wire 81 disposed on the glass substrate 8 as a substrate, thereby being able to join the lead wire 81 to the glass substrate 8.

The ultrasonic joining processing includes plural pieces of partial ultrasonic joining processing performed in a plurality of joining positions on the lead wire 81. The plural pieces of partial ultrasonic joining processing are performed while the joining head unit 3 is moved at a predetermined pitch in a left direction in FIG. 3, for example.

Joining tension control processing described hereinafter is performed under control of the ultrasonic joining apparatus control board 20 during a period of performing the ultrasonic joining processing including the plural pieces of partial ultrasonic joining processing. The tension adjustment unit 5 is set to an actual operation state described hereinafter by the joining tension control processing, and the lead set unit 4 is set to one of the delivery driving, the rewinding driving, and a stopped state.

During the period of performing the ultrasonic joining processing, all of the pair of fixing rollers 54 and the dancer roller 53 in the tension adjustment unit 5 have contact with the lead wire 81.

When the ultrasonic joining processing on the lead wire 81 on the glass substrate 8 is finished, as illustrated in FIG. 4, the joining head unit 3 is moved from the lead clamp position P2 to a lead cut position P1, and enters a lead cut position state. The lead wire grasping unit 7 is also moved along with the movement of the joining head unit 3.

Then, the lead wire grasping unit 7 grasps the lead wire 81 again, and performs cutting processing of cutting the lead wire 81 while grasping the lead wire 81. Accordingly, the lead wire 81 does not deviate but is held by the lead wire grasping unit 7 until the lead wire 81 is joined to the other substrate.

Subsequently, the origin point standby state, the lead clamp position state, and the lead cut position state illustrated in FIG. 2 to FIG. 4 are repeated, and the ultrasonic joining apparatus 100 performs the ultrasonic joining processing of joining the lead wire 81 on the other joining target.

(Lead Set Unit 4)

Figure 5:
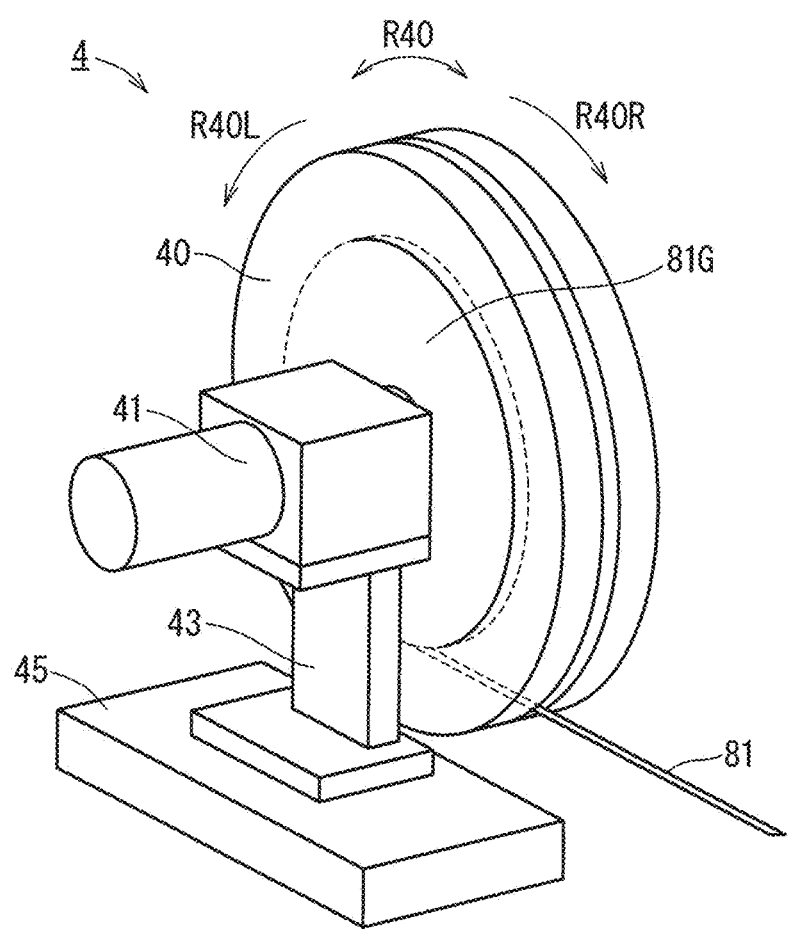
FIG. 5 A perspective view schematically illustrating a whole configuration of a lead set unit in FIG. 1 to FIG. 4.

FIG. 5 is a perspective view schematically illustrating a whole configuration of the lead set unit 4. As illustrated in FIG. 5, the lead set unit 4 includes a lead cassette 40, a drive motor 41, a mounting table 43, and a mechanical frame 45 as main constituent elements.

The lead wire 81 is wound around a support shaft not shown in the lead cassette 40 and housed therein as an in-cassette lead wire 81G.

The drive motor 41 rotates the support shaft, thereby being able to perform the delivery driving and the rewinding driving. When the support shaft is rotated, the in-cassette lead wire 81G and the lead cassette 40 are rotated along a cassette rotation direction R40.

Accordingly, when the lead cassette 40 is rotated along a rotation direction R40L, the delivery driving of sending out the lead wire 81 from the lead cassette 40 can be performed. In the meanwhile, when the lead cassette 40 is rotated along a rotation direction R40R, the rewinding driving of housing the lead wire 81 in the lead cassette 40 can be performed. The rotation direction R40L and the rotation direction R40L are directions opposite to each other.

With regard to the delivery driving, a lead wire delivery speed (rotation speed of the lead cassette 40 along the rotation direction R40L) in the delivery driving is set under control of the ultrasonic joining apparatus control board 20. In this manner, the delivery driving includes a function of setting the lead wire delivery speed. Accordingly, variable setting of the lead wire delivery speed can be performed under control of the ultrasonic joining apparatus control board 20.

In the similar manner, with regard to the rewinding driving, a lead wire rewinding speed (rotation speed of the lead cassette 40 along the rotation direction R40R) in the rewinding driving is set under control of the ultrasonic joining apparatus control board 20. In this manner, the rewinding driving includes a function of setting the lead wire rewinding speed. Accordingly, variable setting of the lead wire rewinding speed can be performed under control of the ultrasonic joining apparatus control board 20. The drive motor 41 can also enter the stopped state in which any of the delivery driving and the rewinding driving is not performed. Drive control of the drive motor 41 is performed by the ultrasonic joining apparatus control board 20.

The drive motor 41 is mounted on the mounting table 43, and the mounting table 43 is fixed on the mechanical frame 45.

(Tension Adjustment Unit 5)

Figure 6:
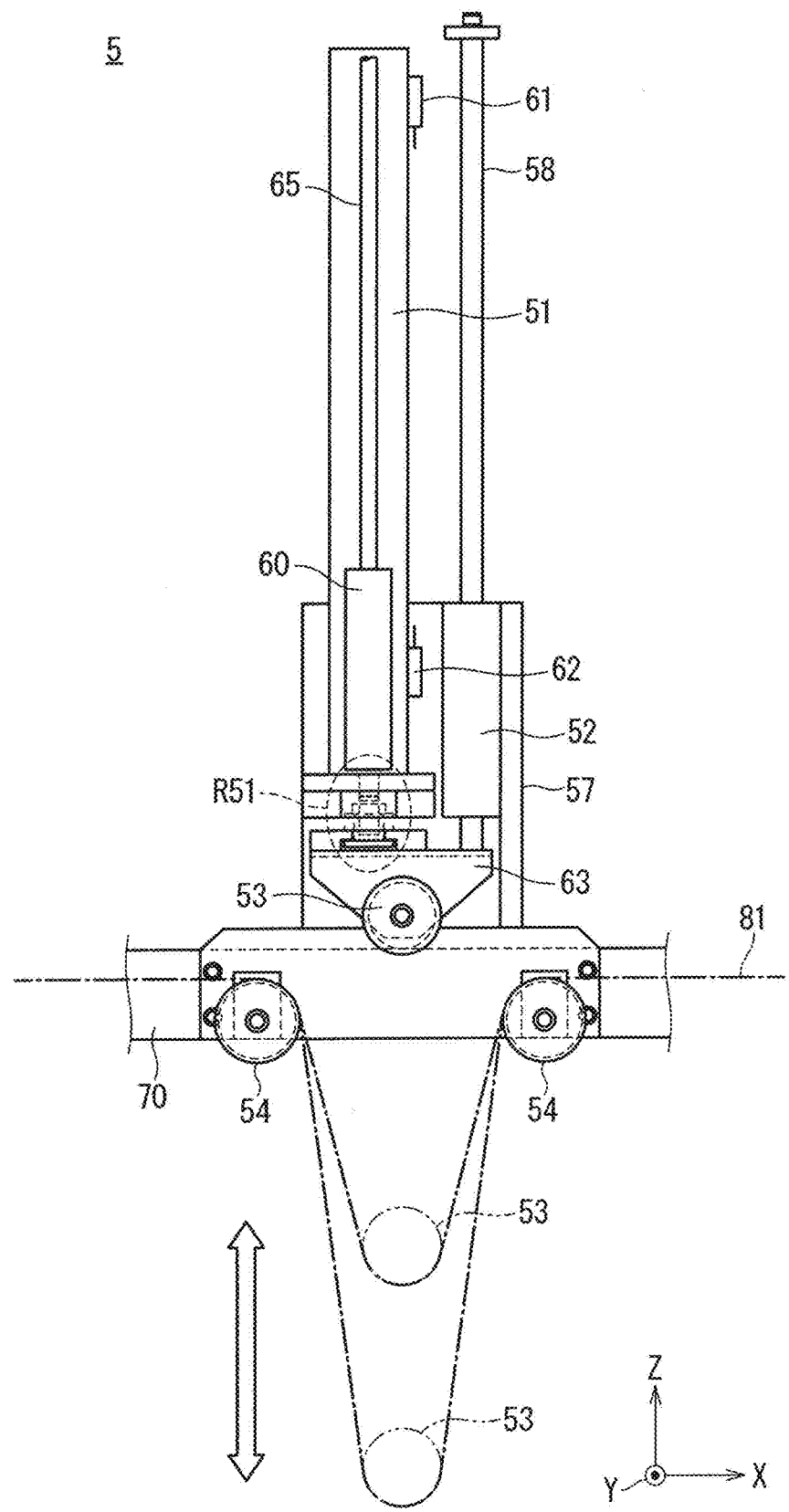
FIG. 6 An explanation diagram (front view) illustrating a configuration of a tension adjustment unit in FIG. 1 to FIG. 4.
Figure 7:
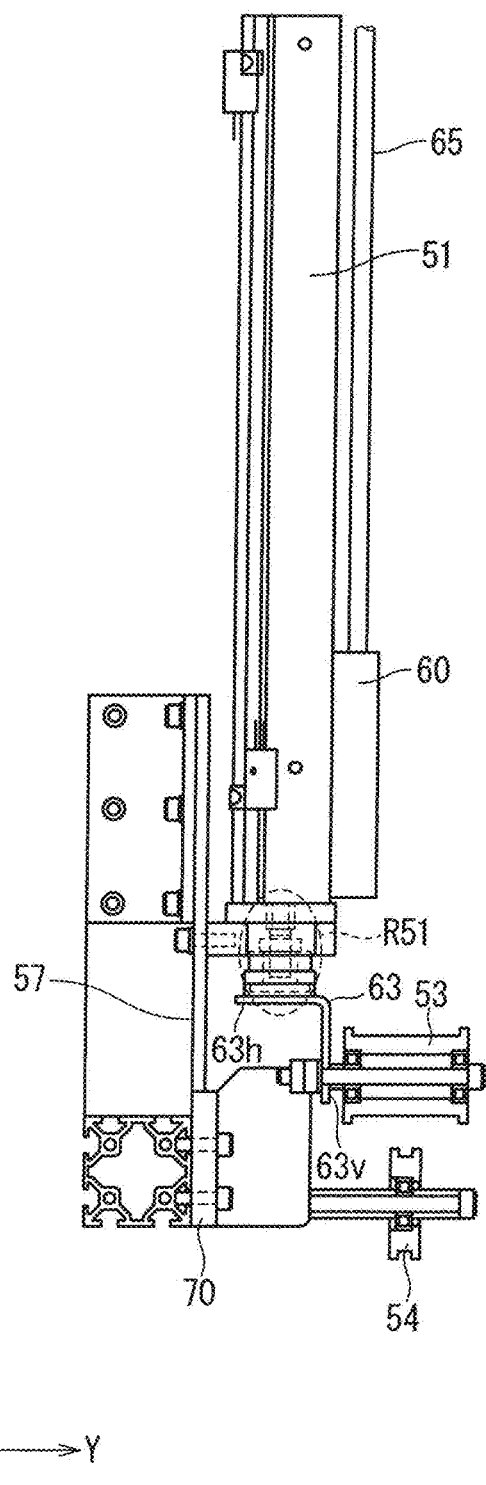
FIG. 7 An explanation diagram (side view) illustrating a configuration of the tension adjustment unit.
Figure 8:
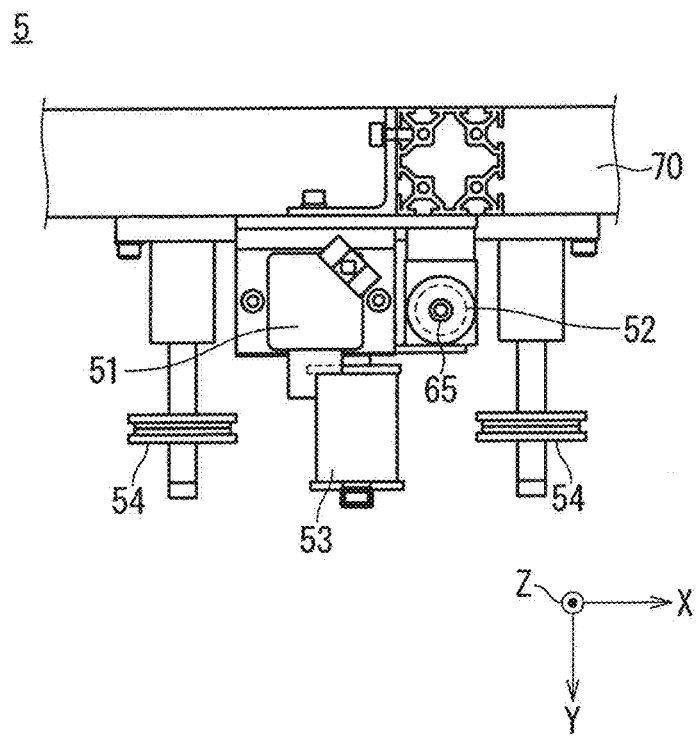
FIG. 8 An explanation diagram (top view) illustrating a configuration of the tension adjustment unit.

FIG. 6 to FIG. 8 are explanation diagrams each illustrating a configuration of the tension adjustment unit 5. FIG. 6 is a front view, FIG. 7 is a side view, and FIG. 8 is a top view. An XYZ rectangular coordinate system is illustrated in FIG. 6 to FIG. 8.

As illustrated in FIG. 6 to FIG. 8, the tension adjustment unit 5 includes an air cylinder 51, an elevating guide 52, the dancer roller 53, the pair of fixing rollers 54, a support frame 57, a guide rod 58, a dancer roller bracket 63, and an apparatus frame 70 as main constituent elements.

The air cylinder 51 includes a length measurement unit 60, an upper limit sensor 61, a lower limit sensor 62, and an electrical wire cable 65 as main constituent elements, and the dancer roller bracket 63 is attached to a tip end portion of an extendable rod. In FIG. 6 and FIG. 7, the rod protrudes outside in a rod extension region R51.

As illustrated in FIG. 7, the dancer roller bracket 63 has a bending structure including a horizontal region 63h extending in a horizontal direction (+Y direction) and a vertical region 63v extending to a lower side (−Z direction) from the horizontal region 63h in a side view (on a YZ plane) The horizontal region 63h of the dancer roller bracket 63 is attached to the tip end portion of the rod, and the dancer roller 53 is attached to the vertical region 63v.

In this manner, the tension adjustment unit 5 has a structure that the dancer roller 53 is attached to the tip end of the rod of the air cylinder 51 via the dancer roller bracket 63.

The elevating guide 52 is attached to the support frame 57, the guide rod 58 is provided to pass through the elevating guide 52, and the elevating guide 52 functions as a bearing of the guide rod 58, thereby slidably holding the guide rod 58.

The rod of the air cylinder 51 can perform an extension motion along a vertical direction (Z direction). The dancer roller bracket 63, the dancer roller 53, and the guide rod 58 are also moved along with the extension motion of the rod of the air cylinder 51.

The guide rod 58 is guided in the vertical direction in the elevating guide 52, thus the rod of the air cylinder 51 can stably perform the extension motion along the vertical direction.

In the meanwhile, the pair of fixing rollers 54 are attached to the apparatus frame 70. As illustrated in FIG. 8, the pair of fixing rollers 54 are disposed to sandwich the dancer roller 53 in a plan view. The apparatus frame 70 is provided independently from the rod of the air cylinder 51, thus an arrangement height of the pair of fixing rollers 54 is fixed.

The length measurement unit 60 has a length measurement function of measuring a cylinder stroke. The cylinder stroke has a length of the rod protruding from an inner portion of the air cylinder 51. In FIG. 6 and FIG. 7, a protrusion length of the rod shown in the rod extension region R51 is the cylinder stroke.

The length measurement unit 60 outputs an electrical signal indicating the cylinder stroke as a cylinder stroke signal ES60 using a known optical pulse count system or variable resistance expression. The cylinder stroke signal ES60 is given to the ultrasonic joining apparatus control board 20 described hereinafter via the electrical wire cable 65.

The optical pulse count system is performed using a measurement plate including a plurality of slits. The plurality of slits are provided at regular intervals along a predetermined direction. A circumferential direction or a straight direction is considered as the predetermined direction. The measurement plate performs a measurement movement motion in which the plurality of slits are moved in the predetermined direction in accordance with the extension motion of the rod. Then, a pulse is generated when light passing through the slits is detected by a light receiving element, and the number of pulses caused by the measurement movement motion is counted, thus the cylinder stroke can be detected.

The variable resistance expression is performed using a resistance fluctuation terminal moved in accordance with the extension motion of the rod. In the variable resistance expression, the cylinder stroke can be detected based on a measurement resistance value having a positive correlation with a movement amount of the resistance fluctuation terminal.

In this manner, the length measurement unit 60 has an electrical signal output function of outputting an electrical signal outside via the electrical wire cable 65 using the optical pulse count system or the variable resistance expression.

The upper limit sensor 61 provided on an upper side of the air cylinder 51 detects presence or absence of an uppermost portion of the rod in the air cylinder 51 near the upper limit sensor 61, thereby detecting whether or not the rod reaches an upper limit state, and outputs an upper limit signal ES61 indicating presence or absence of the upper limit state. The upper limit state indicates that the rod is shortened to be shortest.

The lower limit sensor 62 provided on a lower side of the air cylinder 52 detects presence or absence of an uppermost portion of the rod in the air cylinder 52 near the lower limit sensor 62, thereby detecting whether or not the rod reaches a lower limit state, and outputs a lower limit signal ES62 indicating presence or absence of the lower limit state. The lower limit state indicates that the rod is elongated to be longest.

The upper limit sensor 61 and the lower limit sensor 62 use a known non-contact switch or contact switch, thereby being able to detect the upper limit state or the lower limit state. A known limit switch or photoelectronic sensor may be used as the upper limit sensor 61 and the lower limit sensor 62.

(Control System)

Figure 9:
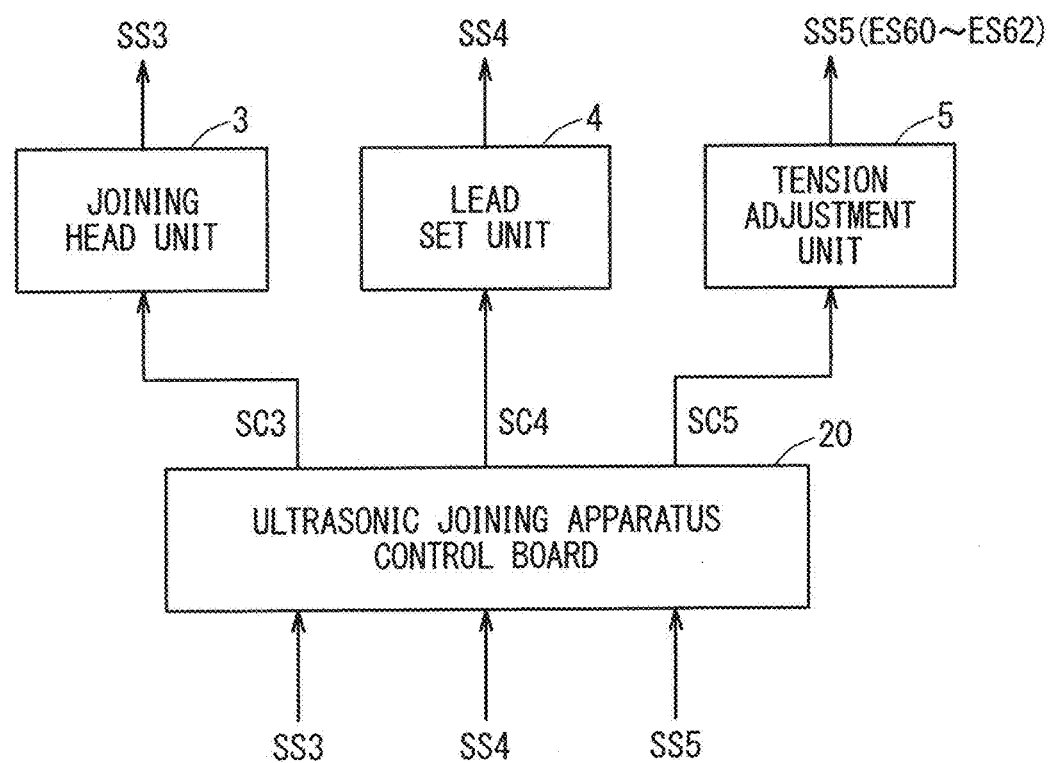
FIG. 9 A block diagram schematically illustrating a control system in the ultrasonic joining apparatus.

FIG. 9 is a block diagram schematically illustrating a control system in the ultrasonic joining apparatus 100 according to the present embodiment. As illustrated in FIG. 9, the operation of each of the joining head unit 3, the lead set unit 4, and the tension adjustment unit 5 is performed under control of the ultrasonic joining apparatus control board 20 as a controller.

The ultrasonic joining apparatus control board 20 outputs a control signal SC3 to the joining head unit 3, thereby controlling the ultrasonic joining processing of the joining head unit 3. The ultrasonic joining apparatus control board 20 receives a sense signal SS3 from the joining head unit 3 to recognize various pieces of information in the joining head unit 3.

The ultrasonic joining apparatus control board 20 outputs a control signal SC4 to the lead set unit 4, thereby controlling the delivery driving and the rewinding driving of the lead set unit 4. The ultrasonic joining apparatus control board 20 receives a sense signal SS4 from the lead set unit 4 to recognize various pieces of information in the lead set unit 4.

The ultrasonic joining apparatus control board 20 outputs a control signal SC5 to the tension adjustment unit 5, thereby controlling the tension adjustment processing of the tension adjustment unit 5, for example. The ultrasonic joining apparatus control board 20 receives a sense signal SS5 from the tension adjustment unit 5 to recognize various pieces of information in the tension adjustment unit 5. The sense signal SS5 includes the cylinder stroke signal ES60, the upper limit signal ES61, and the lower limit signal ES62 described above.

In this manner, the ultrasonic joining apparatus control board 20 controls the apparatus operation processing including the ultrasonic joining processing, the delivery driving, the rewinding driving, and the tension adjustment processing in the whole ultrasonic joining apparatus 100.

Figure 10:
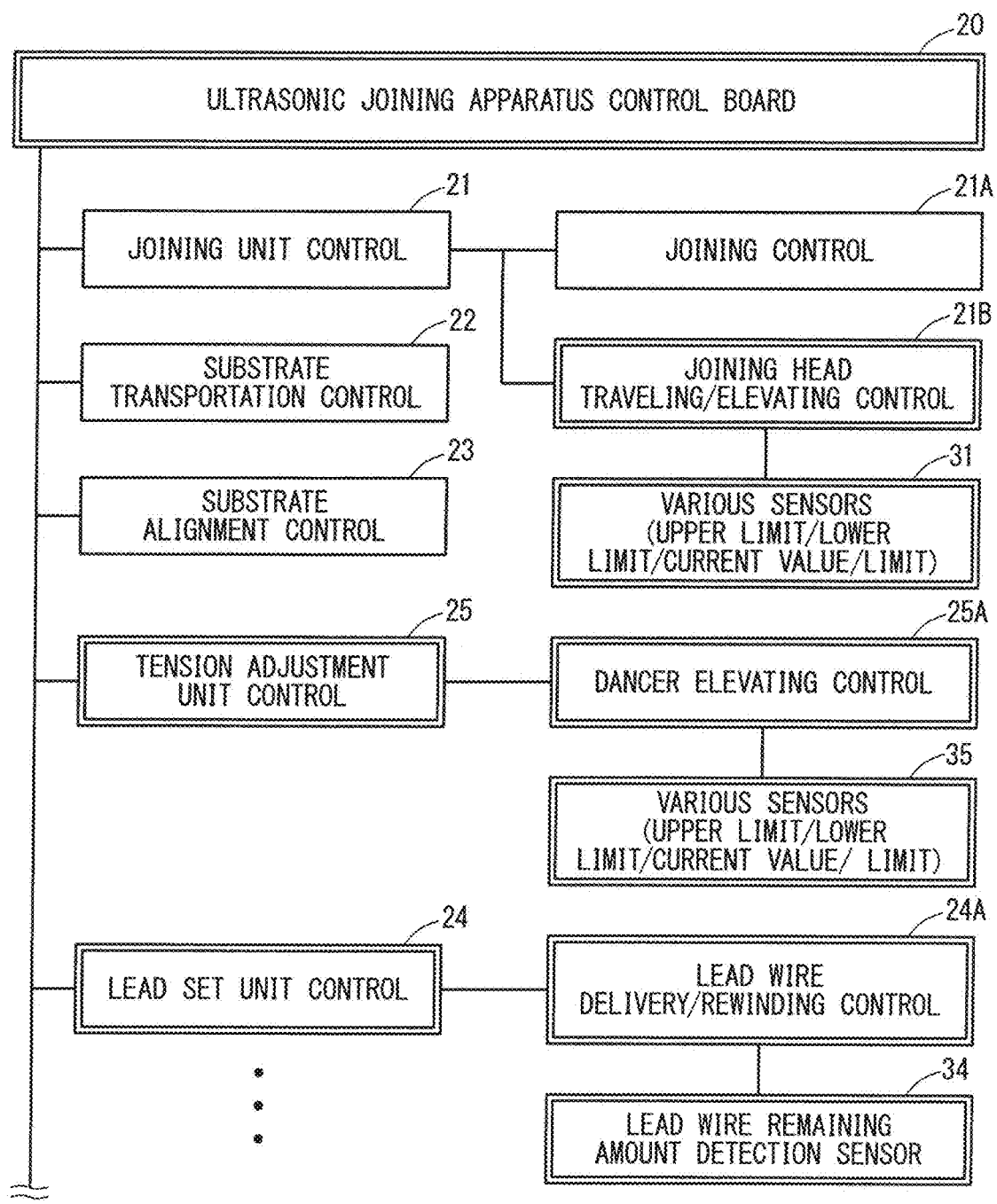
FIG. 10 An explanation diagram schematically illustrating control contents performed under control of an ultrasonic joining apparatus control board in FIG. 9.

FIG. 10 is an explanation diagram schematically illustrating control contents performed under control of the ultrasonic joining apparatus control board 20. The control contents of the ultrasonic joining apparatus control board 20 as the controller are described hereinafter with reference to FIG. 10. Control, for example, indicated by frames of double lines in FIG. 10 relates to the ultrasonic joining apparatus 100 according to the present embodiment.

The control of the apparatus operation processing performed by the ultrasonic joining apparatus control board 20 includes joining unit control 21, substrate transportation control 22, substrate alignment control 23, lead set unit control 24, and tension adjustment unit control 25.

The joining unit control 21 includes joining control 21A and joining head traveling-elevating control 21B. The joining control 21A is control of the ultrasonic joining processing performed by the joining head unit 3, and the joining head traveling-elevating control 21B includes control of traveling between the origin position P0 to the lead clamp position P2 performed by the joining head unit 3 and control of elevating the joining head unit 3 so that the joining head unit 3 can be joined.

The joining head unit 3 is provided with various sensors 31, and the various sensors 31 have a function of detecting a current value of the joining head unit 3, a travel speed of the joining head unit 3, an upper limit position and a lower limit position in a height direction, and a limit state where there is abnormality in a horizontal direction and a height direction, for example. Various pieces of information detected in the various sensors 31 is given to the ultrasonic joining apparatus control board 20 as the sense signal SS3.

The substrate transportation control 22 is control driving the transportation conveyer 120 to transport the glass substrate 8, and the substrate alignment control 23 is control positioning the glass substrate 8. The substrate transportation control 22 and the substrate alignment control 23 are not feature parts of the ultrasonic joining apparatus 100 according to the present embodiment, thus the detailed description is omitted.

The lead set unit control 24 includes a lead wire delivery-rewinding control 24A. The lead wire delivery-rewinding control 24A is control of the delivery driving and the rewinding driving performed by the drive motor 41 described above.

The lead set unit control 24 is provided with a lead wire remaining amount detection sensor 34. The lead wire remaining amount detection sensor 34 is disposed close to the lead cassette 40 of the lead set unit 4, and detects a lead wire remaining amount shortage state where a remaining amount of the in-cassette lead wire 81G is equal to or smaller than a reference amount.

The tension adjustment unit control 25 includes dancer elevating control 25A. The tension adjustment unit 5 is provided with various sensors 35. The various sensors 35 include the length measurement unit 60, the upper limit sensor 61, and the lower limit sensor 62. The various sensors 35 have a function of detecting a current value, an upper limit position and a lower limit position adjustable in a height direction, and a limit state where there is abnormality in a height direction, for example, of the dancer roller 53. The current value includes the cylinder stroke indicated by the cylinder stroke signal ES60, and the limit state includes the upper limit state and the lower limit state in the air cylinder 51.

(Operation of Ultrasonic Joining Apparatus 100)

Figure 11:
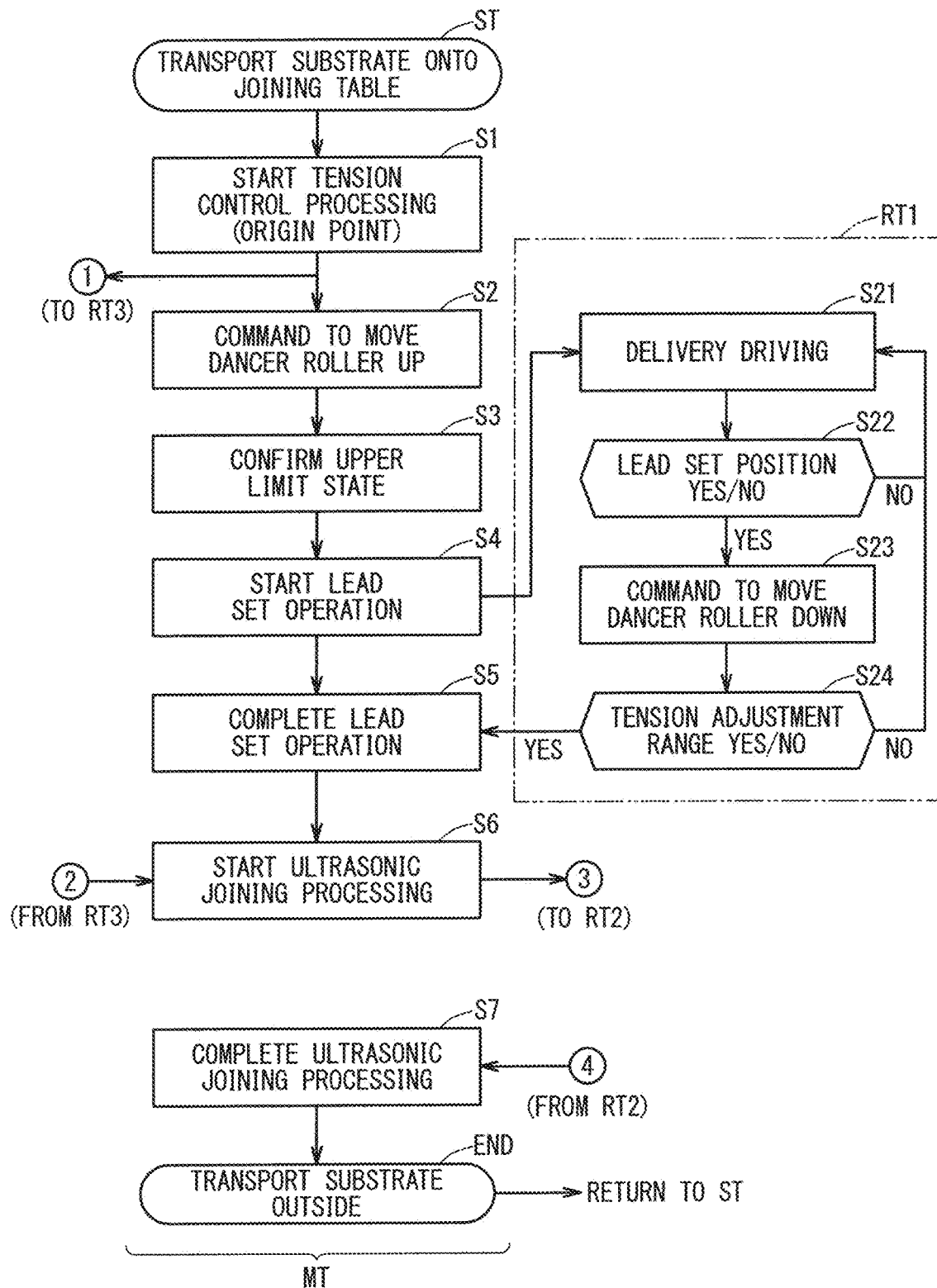
FIG. 11 A flow chart (No. 1) illustrating a processing procedure of tension control processing in the ultrasonic joining apparatus according to the present embodiment.
Figure 12:
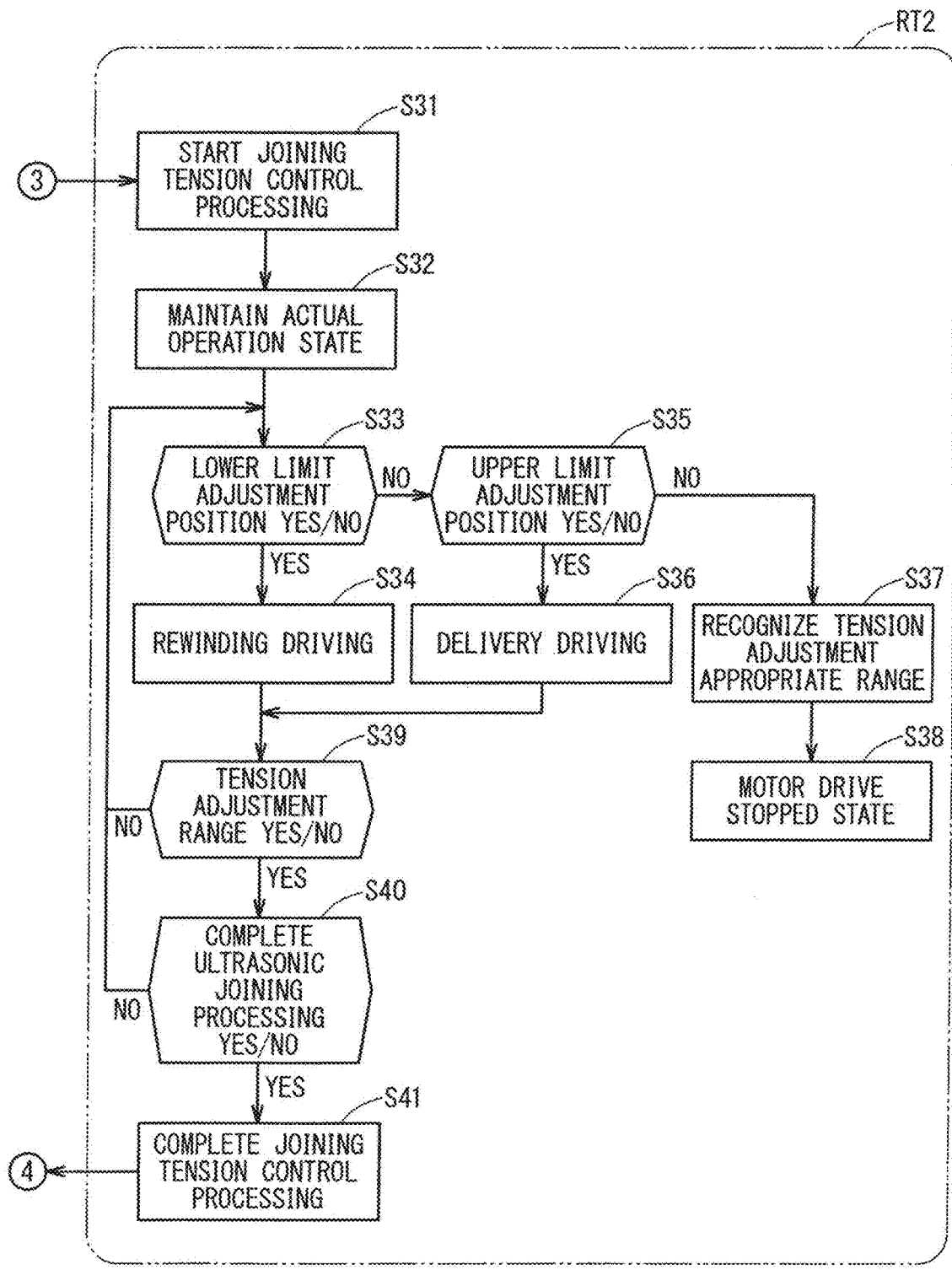
FIG. 12 A flow chart (No. 2) illustrating a processing procedure of tension control processing in the ultrasonic joining apparatus.
Figure 13:
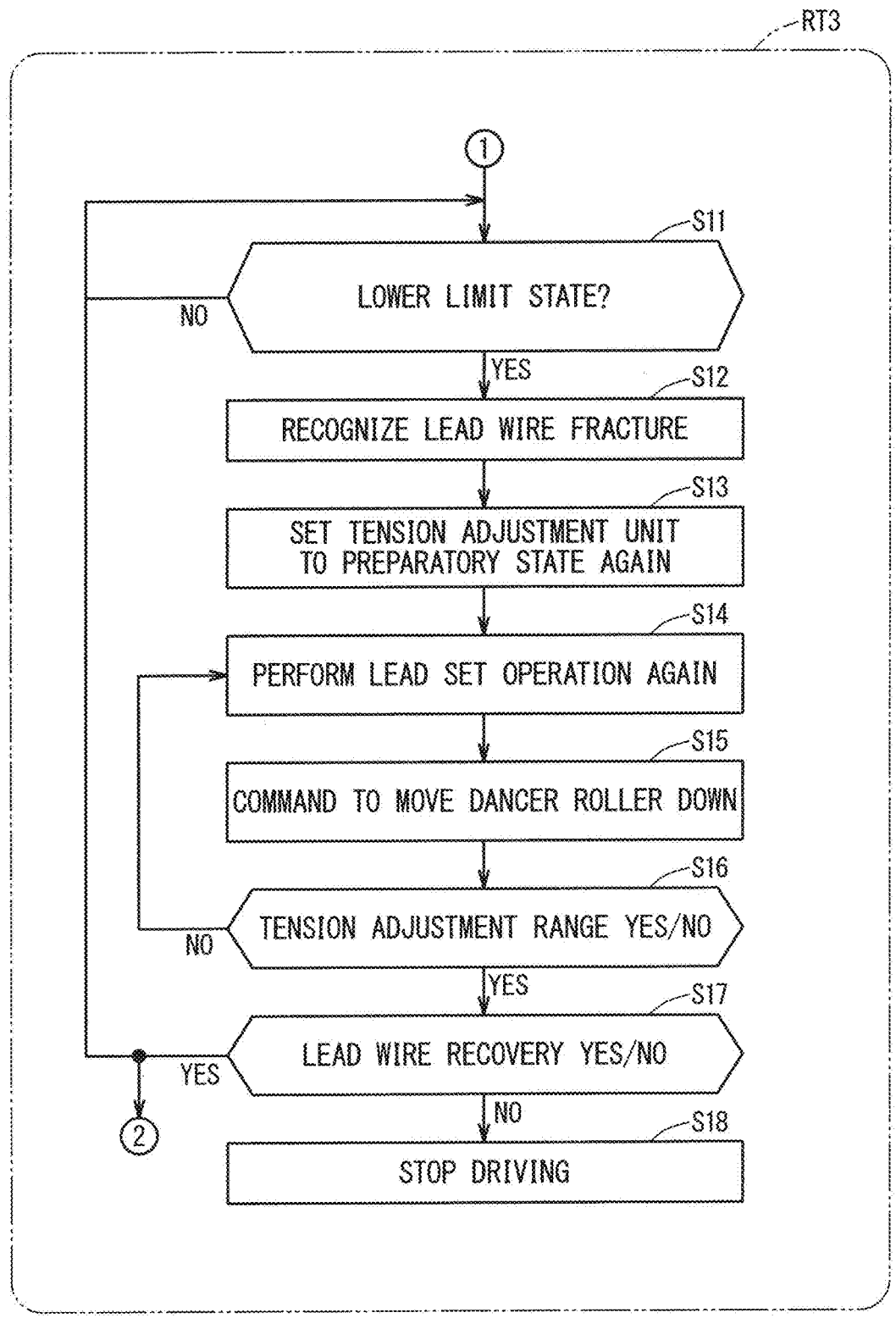
FIG. 13 A flow chart (No. 3) illustrating a processing procedure of tension control processing in the ultrasonic joining apparatus.

FIG. 11 to FIG. 13 are flow charts each illustrating a processing procedure of the tension control processing of the ultrasonic joining apparatus 100 according to the present embodiment illustrated in FIG. 1 to FIG. 10. These operations are performed under control of the ultrasonic joining apparatus control board 20 illustrated in FIG. 9 and FIG. 10. Contents of the tension control processing of the ultrasonic joining apparatus 100 are described hereinafter with reference to FIG. 11 to FIG. 13.

In a start Step ST, a substrate transportation operation of transporting the glass substrate 8 onto the joining table 2 is performed. As illustrated in FIG. 2, the glass substrate 8 is transported onto the joining table 2 by the transportation conveyer 120.

After the start Step ST is performed, a main routine MT including Steps S1 to S7 is performed.

Firstly, the tension control processing is started in Step S1. That is to say, an automatic drive state is established under control of the ultrasonic joining apparatus control board 20. At this time, it is confirmed that associated apparatuses including the joining head unit 3, the lead set unit 4, and the tension adjustment unit 5 are normal using various sensors 31, 34, and 35. As illustrated in FIG. 2, the joining head unit 3 is located in the origin position P0.

Then, in Step S2, the control signal SC5 as a command to "move the dancer roller up" is output from the ultrasonic joining apparatus control board 20 to the tension adjustment unit 5. Then, an operation of shortening the rod of the air cylinder 51 of the tension adjustment unit 5 is performed.

Subsequently, in Step S3, the rod is fixed at a time when the upper limit sensor 61 detects the upper limit state. As a result, the tension adjustment unit 5 enters a preparatory state.

In this manner, the tension adjustment unit 5 is set to be in the preparatory state in an initial state immediately after Step S3 of the main routine MT is performed.

Figure 14:
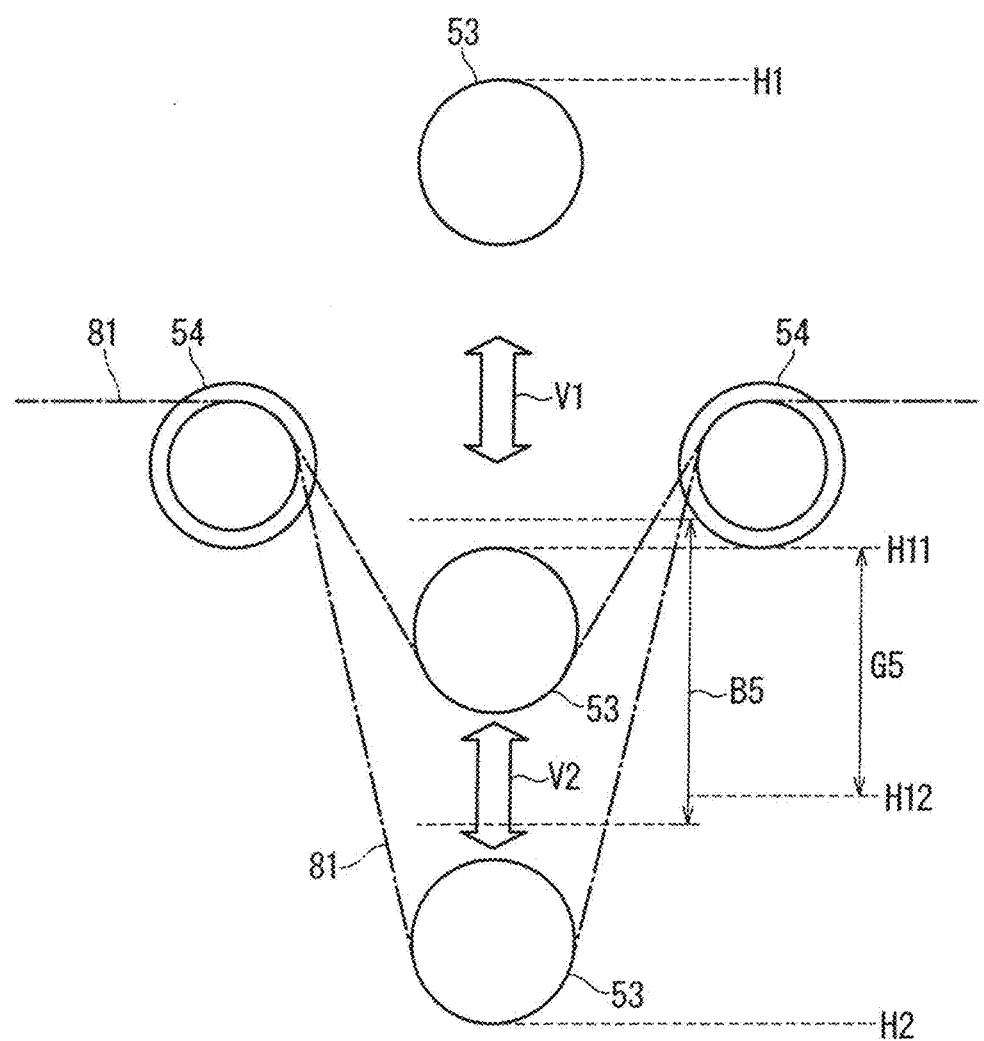
FIG. 14 An explanation diagram schematically illustrating a state of a dancer roller in a tension adjustment unit.

FIG. 14 is an explanation diagram schematically illustrating a state of the dancer roller 53. As illustrated in FIG. 14, a roller upper limit position H1, a roller lower limit position H2, and a tension adjustment range B5 are previously set to control a height of the dancer roller 53. The tension adjustment range B5 indicates a range in an up-down direction, the roller upper limit position H1 as an upper side limit position is set on an upper side of the tension adjustment range B5 outside the tension adjustment range B5, and the roller lower limit position H2 as a lower side limit position is set on a lower side of the tension adjustment range B5 outside the tension adjustment range B5.

Furthermore, an upper limit adjustment position H11 and a lower limit adjustment position H12 are previously set in the tension adjustment range B5. A tension adjustment appropriate range G5 in which the upper limit adjustment position H11 is an uppermost position and a lower limit adjustment position H12 is a lowermost position is included in the tension adjustment range B5, and is narrower than the tension adjustment range B5. Accordingly, the upper limit adjustment position H11 is lower than the uppermost position of the tension adjustment appropriate range G5, and the lower limit adjustment position H12 is higher than the lowermost position of the tension adjustment appropriate range G5.

In Step S3, the state where the upper limit state is detected indicates that an uppermost portion of the dancer roller 53 reaches the roller upper limit position H1. In this manner, the dancer roller 53 is moved up in a first elevating range V1 to locate the dancer roller 53 on the upper side of the tension adjustment range B5, thus the tension adjustment unit 5 enters the preparatory state where the dancer roller is disposed in a position where the tension adjustment processing cannot be performed.

When the cylinder stroke of the rod of the air cylinder 51 is smallest, the uppermost end of the dancer roller 53 reaches the roller upper limit position H1.

After Step S1 is performed, processing subsequent to step S1 and an abnormality detection routine RT3 (refer to FIG. 13) described hereinafter are performed in parallel.

Subsequently, in Step S4, the lead set operation is started, and the processing proceeds to a lead set routine RT1. The lead set routine RT1 is started from an initial state where the tension adjustment unit 5 is set to be in the preparatory state.

The lead set routine RT1 is processing including Steps S21 to S24. Firstly, the drive motor 41 performs the delivery driving in Step S21. The rotation speed of the lead cassette 40 in the delivery driving is set to the lead wire delivery speed under control of the ultrasonic joining apparatus control board 20.

In Step S22, as illustrated in FIG. 3, the joining head unit 3 reaches the lead clamp position P2, and it is verified whether or not a part of the lead wire 81 is fixed at the lead set position on the glass substrate 8 by the lead clamp unit 6 (YES/NO). The verification in Step S22 is performed based on the sense signal SS3 from the various sensors 31 for the joining head unit 3, for example.

The processing in Steps S21 and S22 is processing of making the lead set unit 4 as the lead wire housing mechanism perform the delivery driving so that the lead wire 81 can be disposed in the lead set position on the glass substrate 8 (substrate).

When it is confirmed that the lead wire 81 is fixed at the lead set position (YES) in Step S22, the processing proceeds to Step S23. Subsequently, processing in Steps S21 and S22 is repeated until the result is YES in Step S22.

In Step S23, the control signal SC5 as a command to "move the dancer roller down" is output from the ultrasonic joining apparatus control board 20. Then, the operation of elongating the rod of the air cylinder 51 of the tension adjustment unit 5 is performed, and it is verified whether or not the dancer roller 53 is disposed in the tension adjustment range B5 as the up-down direction range in Step S24 (YES/NO). The verification in Step S24 is performed based on the cylinder stroke signal ES60 from the length measurement unit 60.

In Step S24, when it is confirmed that the dancer roller 53 is disposed in the tension adjustment range B5 (YES), the lead set routine RT1 is finished, and the processing proceeds to Step S5 of the main routine MT.

That is to say, the dancer roller 53 is moved down in the first elevating range V1 to locate the dancer roller 53 in the tension adjustment range B5. As a result, the tension adjustment unit 5 enters the actual operation state where the dancer roller 53 is disposed in a position where the tension adjustment processing can be performed on the lead wire 81.

The processing in Steps S23 and S24 is processing of controlling the tension adjustment unit 5 after the lead wire 81 is disposed in the lead set position and setting the tension adjustment unit 5 to the actual operation state.

As described above, the ultrasonic joining apparatus control board 20 performs control so that predetermined welding pressure is applied from the air cylinder 51 to the dancer roller 53 in the actual operation state. The dancer roller 53 in the actual operation state is pressed down by predetermined welding pressure, thus is moved up and down in accordance with tension on the lead wire 81. That is to say, the dancer roller 53 of the tension adjustment unit 5 is pressed down by the predetermined welding pressure and can be moved up and down.

The dancer roller 53 and the lead wire 81 keep a contact relationship, thus the tension adjustment unit 5 can perform the tension adjustment processing of adjusting tension on the lead wire 81.

As illustrated in FIG. 14, the lead wire 81 has the contact relationship on the upper side of the pair of fixing rollers 54 and the lower side of the dancer roller 53 in the actual operation state of the tension adjustment unit 5. At this time, the predetermined welding pressure is applied to the rod of the air cylinder 51, thus the dancer roller 53 is pressed down by the predetermined welding pressure toward a lower side (−Z direction). The predetermined welding pressure is set to a value appropriate for minimizing fluctuation of the tension on the lead wire 81. This point is described in detail hereinafter.

The dancer roller 53 in the actual operation state can be moved up and down in accordance with the fluctuation of tension on the lead wire 81. Herein considered is a state where the predetermined welding pressure pressing down the dancer roller 53 in the tension adjustment range B5 and the tension on the lead wire 81 is equal to each other (abbreviated as "tension equal state" hereinafter).

When the tension on the lead wire 81 is reduced in the tension equal state, the dancer roller 53 is moved down, thus the tension on the lead wire 81 increases, and the tension equal state is established again.

In the meanwhile, when the tension on the lead wire 81 is increased in the tension equal state, the dancer roller 53 is moved up, thus the tension on the lead wire 81 decreases, and the tension equal state is established again.

In this manner, the predetermined welding pressure is given to the dancer roller 53, thus the tension can be mechanically adjusted along with the fluctuation of the tension on the lead wire 81 caused by the up-down movement of the dancer roller 53 located in the tension adjustment range B5.

After the completion of the lead set operation is recognized in Step S5 of the main routine MT illustrated in FIG. 11, the ultrasonic joining processing is stared in Step S6.

In the meanwhile, when the arrangement of the dancer roller 53 in the tension adjustment range B5 is not confirmed in Step S24 (NO), the processing returns to Step S21. Subsequently, processing in Steps S21 to S24 is repeated until the result is YES in Step S24. When Step S21 is performed twice, the performance of the delivery driving is appropriately omitted.

In Step S6, the ultrasonic joining processing is started, and the processing transitions to the joining operation routine RT2. As illustrated in FIG. 12, the joining operation routine RT2 includes Steps S31 to S41.

In Step S31, the tension adjustment unit 5 starts the joining tension control processing. Firstly, in Step S32, the actual operation state of the dancer roller 53 set in Step S24 of the lead set routine RT1 is maintained.

During the period of performing the joining tension control processing, the ultrasonic joining apparatus control board 20 receives the cylinder stroke signal ES60 every moment from the length measurement unit 60 of the air cylinder 51, thereby constantly recognizing the position of the dancer roller 53 in the tension adjustment range B5.

Then, in Step S33, it is verified whether or not the lowermost end of the dancer roller 53 reaches the lower limit adjustment position H12 (YES or NO).

In Step S34 performed in the case of YES in Step S33, the drive motor 41 of the lead set unit 4 is operated to perform the rewinding driving.

As a result, the lead wire 81 is rewound in the lead cassette 40, thus the dancer roller 53 is moved to the upper side by increase of the tension on the lead wire 81 in accordance with a rewinding amount of the lead wire 81.

In this manner, Step S34 serves as a step of making the lead set unit 4 as the lead wire housing mechanism perform the rewinding driving so that the dancer roller 53 is housed in the tension adjustment range B5 when the lowermost end of the dancer roller 53 reaches the lower limit adjustment position H12. The state where "the lowermost end of the dancer roller 53 reaches the lower limit adjustment position H12" indicates that the lowermost end of the dancer roller 53 is located in the same position as the lower limit adjustment position H12 or a position lower than the lower limit adjustment position H12.

In Step S35 performed in the case of NO in Step S33, it is verified whether or not the uppermost end of the dancer roller 53 reaches the upper limit adjustment position H11 (YES or NO).

In Step S36 performed in the case of YES in Step S35, the drive motor 41 of the lead set unit 4 is operated to perform the deliver driving.

As a result, the lead wire 81 is send out from the lead cassette 40, thus the dancer roller 53 is moved to the lower side by decrease of the tension on the lead wire 81 in accordance with a deliver amount of the lead wire 81.

In this manner, Step S36 serves as a step of making the lead set unit 4 perform the deliver driving so that the dancer roller 53 is housed in the tension adjustment range B5 when the uppermost end of the dancer roller 53 reaches the upper limit adjustment position H11. The state where "the uppermost end of the dancer roller 53 reaches the upper limit adjustment position H11" indicates that the uppermost end of the dancer roller 53 is located in the same position as the upper limit adjustment position H11 or a position higher than the upper limit adjustment position H11.

In Step S37 performed in the case of NO in Step S35, it is recognized that the dancer roller 53 is located in the tension adjustment appropriate range G5 in the tension adjustment range B5 (refer to FIG. 14).

In subsequent Step S38, a motor drive stopped state of stopping the driving of the drive motor 41 is established. Any of the rewinding driving and the delivery driving is not performed in the motor drive stopped state.

In this manner, in the joining operation routine RT2, Steps S33 to S38 are performed, thus the rotation driving of the lead cassette 40 including the rewinding driving and the delivery driving on the lead set unit 4 is intermittently performed.

Step S39 is performed after performing Step S34 or Step S36. In Step S39, it is finally confirmed whether or not the dancer roller 53 is located in the tension adjustment range B5 (YES or NO).

In the case of NO in Step S39, the processing returns to Step S33. Subsequently, processing in Steps S33 to S39 is repeated until the result is YES in Step S39 or NO in Step S35.

In the case of YES in Step S39 or after performing Step S38, Step S40 is performed. In Step S40, it is confirmed whether or not "the ultrasonic joining processing" is completed (YES/NO). That is to say, it is confirmed whether or not all of the plural pieces of partial ultrasonic joining processing included in the ultrasonic joining processing are completed.

In the case of NO in Step S40, the processing returns to Step S33. Subsequently, processing in Steps S33 to S40 is repeated until the result is YES in Step S40.

In Step S41 performed in the case of YES in Step S40, completion of the ultrasonic joining processing and the joining tension control processing is recognized, the joining operation routine RT2 is finished, and the processing proceeds to Step S7 of the main routine MT.

In this manner, the ultrasonic joining apparatus 100 according to the present embodiment performs the joining operation routine RT2 including Steps S31 to S41.

As described above, the ultrasonic joining processing includes plural pieces of partial ultrasonic joining processing performed in a plurality of joining positions on the lead wire 81. Thus, as the lead wire 81 is joined on the glass substrate 8, the lead wire 81 slightly extends by pressurized vibration, and as a result, there is a possibility that the lead wire 81 is loosened and the tension on the lead wire 81 is reduced unexpectedly.

When the tension on the lead wire 81 is reduced unexpectedly, the dancer roller 53 is moved down to a lower side of the lowermost position of the tension adjustment range B5, and appropriate tension adjustment processing cannot be performed on the lead wire 81 by the dancer roller 53.

However, in the joining operation routine RT2, Steps S33 and S34 are performed, thus even when the tension on the lead wire 81 is reduced unexpectedly, the reduction in tension on the lead wire 81 can be immediately resolved by rewinding the lead wire 81 in the lead cassette 40 by the rewinding driving.

In the meanwhile, when the rewinding amount of the lead wire 81 in the lead cassette 40 by the rewinding driving gets too large, there is a possibility that the lead wire 81 is tightened, and the tension on the lead wire 81 is increased unexpectedly.

When the tension on the lead wire 81 is increased unexpectedly, the dancer roller 53 is moved up to an upper side of the uppermost position of the tension adjustment range B5, and appropriate tension adjustment processing cannot be performed on the lead wire 81 by the dancer roller 53.

However, in the joining operation routine RT2, Steps S35 and S36 are performed, thus even when the tension on the lead wire 81 is increased unexpectedly, the increase in the tension on the lead wire 81 can be immediately resolved by sending out the lead wire 81 from the lead cassette 40 by the delivery driving.

In Step S7 of the main routine MT, the completion of the ultrasonic joining processing is recognized, and a substrate transportation operation of transporting the glass substrate 8 to an outer side is performed as final Step END. The glass substrate 8 to which the lead wire 81 is joined is transported from the joining table 2 to the outer side by the transportation conveyer 120.

As described above, the abnormality detection routine RT3 is performed in parallel to the processing in Steps S1 to S7, S21 to S24, and S31 to S41 described above.

As illustrated in FIG. 13, the abnormality detection routine RT3 includes Steps S11 to S18. Firstly, in Step S11, it is verified whether or not the lower limit state is detected (YES/NO). The processing in Step S11 is performed based on the command contents of the lower limit signal ES62 outputted from the lower limit sensor 62.

In the case of NO in Step S11, abnormality is not detected, and the processing returns to Step S11. That is to say, abnormality tension control processing in Step S12 and subsequent steps is not performed until the lower limit state is recognized (YES) in Step S11.

In the case of YES in in Step S11, the abnormality tension control processing including Steps S12 to S18 is performed. That is to say, a condition for starting the abnormality tension control processing is that the position of the lowermost end of the dancer roller 53 reaches the roller lower limit position H2 as the lower limit position.

Firstly, in Step S12, it is recognized that the lead wire 81 is in a fractured state. The reason is that it is assumed that the lead wire 81 is fractured and the dancer roller 53 and the lead wire 81 do not have contact with each other, thus the dancer roller 53 is moved down to the roller lower limit position H2. Specifically, when the dancer roller 53 has no contact relationship with the lead wire 81, force against the welding pressure given to the dancer roller 53 is "0", and as a result, the dancer roller 53 is moved down in a second elevating range V2 (refer to FIG. 14), and the lowermost end reaches the roller lower limit position H2.

When the cylinder stroke of the rod of the air cylinder 51 is largest, the lowermost end of the dancer roller 53 reaches the roller lower limit position H2.

Subsequently, in Step S13, the tension adjustment unit 5 is set to the preparatory state again. That is to say, the processing similar to that in Steps S2 and S3 illustrated in FIG. 11 is performed again, and the dancer roller 53 is moved up again so that the uppermost end thereof reaches the roller upper limit position H1.

Next, the lead set operation is performed again in Step S14. That is to say, the processing similar to that in Steps S21 and S22 in the lead set routine RT1 illustrated in FIG. 11 is performed again. Specifically, Step S14 is a step of making the lead set unit 4 perform the delivery driving so that the lead wire 81 can be disposed in the lead set position on the glass substrate 8 again.

Then, in Step S15, "command of moving the dancer roller 53 down" similar to that in Step S23 illustrated in FIG. 11 is performed. Step S15 is a step of controlling the tension adjustment unit 5 after the lead wire 81 is disposed in the lead set position again and setting the tension adjustment unit 5 to the actual operation state again.

Next, performed in Step S16 is processing of confirming whether or not "the dancer roller 53 is disposed in the tension adjustment range B5" (YES/NO) in the manner similar to Step S24 illustrated in FIG. 11. In the case of NO in Step S16, the processing returns to Step S14. Subsequently, processing in Steps S14 to S16 is repeated until the result is YES in Step S16.

In Step S17 performed in the case of YES in Step S16, it is finally confirmed whether or not the lead wire is recovered (YES/NO). For example, it can be finally confirmed whether or not the lead wire is recovered (YES/NO) by confirming that some abnormality is not detected by the various sensors 31, 34, and 35 for the joining head unit 3, the lead set unit 4, and the tension adjustment unit 5.

In the case of YES in Step S17, the processing returns to Step S6 of the main routine MT illustrated in FIG. 11, the ultrasonic joining processing is started again, and the processing returns to Step S11 to perform the abnormality detection routine RT3.

In the meanwhile, in the case of NO in Step S17, automatic recovery by the abnormality detection routine RT3 is determined to be difficult, and driving of the ultrasonic joining apparatus 100 is stopped in Step S18. The driving of the ultrasonic joining apparatus 100 is stopped, thus checking by a user can be promoted.

(Effect)

The ultrasonic joining apparatus 100 according to the present embodiment performs the joining tension adjustment processing as the joining operation routine RT2 illustrated in FIG. 12 under control of the ultrasonic joining apparatus control board 20 as the controller, thus houses the dancer roller 53 in the tension adjustment range B5 during the period of performing the ultrasonic joining processing.

In the tension adjustment unit 5 as the tension adjustment mechanism, the tension adjustment range B5 can be previously set in the range where fluctuation of the predetermined welding pressure given to the dancer roller 53 is relatively small.

The ultrasonic joining apparatus 100 performs Steps S33 to S36 in the joining operation routine RT2 under control of the ultrasonic joining apparatus control board 20, and selectively performs the rewinding driving and the delivery driving as necessary, thus the dancer roller 53 is always disposed in the tension adjustment range B5 during the period of performing the ultrasonic joining processing.

Accordingly, the tension on the lead wire 81 can be stably maintained in the constant tension range by the dancer roller 53 disposed in the tension adjustment range B5 and pressed down at the predetermined welding pressure during the period of performing the ultrasonic joining processing by the joining head unit 3.

As a result, the ultrasonic joining apparatus 100 can perform the ultrasonic joining processing of accurately joining the lead wire 81 to the glass substrate 8.

At this time, it is sufficient that the lead set unit 4 as the lead wire housing mechanism performs the delivery driving and the rewinding driving using the drive motor 41. It is sufficient that the tension adjustment unit 5 can perform the elevating operation of the dancer roller 53 to achieve the setting of the preparatory state and the actual operation state, and can give the predetermined welding pressure to the dancer roller 53 using the air cylinder 51.

In this manner, the ultrasonic joining apparatus 100 according to the present embodiment can perform only relatively easy drive (operation) contents required for the lead set unit 4 and the tension adjustment unit 5. As a result, the ultrasonic joining apparatus 100 can be achieved relatively inexpensively.

The ultrasonic joining apparatus 100 according to the present embodiment performs the lead set routine RT1 illustrated in FIG. 11 as the previous tension control processing under control of the ultrasonic joining apparatus control board 20, thus can stably perform the setting to be able to start the ultrasonic joining processing in Step S6 and the subsequent steps.

Furthermore, the ultrasonic joining apparatus 100 makes the lead set unit 4 perform the delivery driving in the lead set operation, thus can keep the tension on the lead wire 81 in a constant state compared with a case where the lead wire 81 is drawn from the lead cassette 40 and disposed in the lead set position of the lead wire 81.

This point is described in detail hereinafter. When the lead wire 81 is drawn from the lead cassette 40, the load on the lead wire 81 changes depending on a remaining state of the in-cassette lead wire 81G in the lead cassette 40. Specifically, when there is a large remaining amount of the in-cassette lead wire 81G in an initial state, the lead wire 81 can be drawn with relatively small force, however, when there is a small remaining amount of the in-cassette lead wire 81H in a final state, the lead wire 81 needs to be drawn with relatively large force.

In the meanwhile, in the present embodiment, the lead wire 81 can be sent out at a constant lead wire delivery speed by the drive motor 41, thus the load on the lead wire 81 can be limited and stabilized.

Thus, the ultrasonic joining apparatus 100 according to the present embodiment can stably perform the lead set operation without disconnecting the lead wire 81.

The ultrasonic joining apparatus 100 according to the present embodiment performs the abnormality tension control processing (Steps S12 to S18) included in the abnormality detection routine RT3 illustrated in FIG. 13 under control of the ultrasonic joining apparatus control board 20, thereby being able to immediately recover the state to perform the ultrasonic joining processing again after the lead wire 81 is fractured.

The length measurement unit 60 of the air cylinder 51 in the tension adjustment unit 5 has the length measurement function capable of recognizing the cylinder stroke. Thus, the ultrasonic joining apparatus control board 20 according to the present embodiment can accurately recognize the position of the dancer roller 53 based on the cylinder stroke measured by the length measurement unit 60.

Furthermore, the length measurement unit 60 has the electrical signal output function of outputting the electrical signal indicating the number of pulse count or a variable resistance value as information indicating the cylinder stroke. Accordingly, the ultrasonic joining apparatus control board 20 can recognize the cylinder stroke relatively easily based on the cylinder stroke signal ES60 as the electrical signal.

The ultrasonic joining apparatus 100 according to the present embodiment can make the lead set unit 4 perform the delivery driving including a speed setting function of setting the lead wire delivery speed under control of the ultrasonic joining apparatus control board 20.

Accordingly, variable setting of the lead wire delivery speed can be performed under control of the ultrasonic joining apparatus control board 20.

Thus, when the ultrasonic joining apparatus 100 performs the ultrasonic joining processing, the lead wire delivery speed can be set to be fit to the movement speed of the joining head unit 3 including the ultrasonic joining head.

Specifically, the lead wire delivery speed (linear velocity) is preferably set to be slightly larger than the movement speed of the joining head unit 3.

As a result, the ultrasonic joining apparatus 100 according to the present embodiment can perform the more accurate ultrasonic joining processing.

<Other>

In the present embodiment, the tension adjustment appropriate range G5 narrower than the tension adjustment range B5 is set, the upper limit adjustment position H11 is set to be slightly lower than the uppermost position of the tension adjustment range B5, and the lower limit adjustment position H12 is set to be slightly higher than the lowermost position of the tension adjustment range B5. In place of this setting, it is also applicable that the uppermost position of the tension adjustment range B5 is set to the upper limit adjustment position and the lowermost position of the tension adjustment range B5 is set to the lower limit adjustment position without setting the tension adjustment appropriate range G5.

The present invention has been shown and described in detail, the foregoing description is in all aspects illustrative, thus the present invention is not limited thereto. It is therefore understood that numerous modification examples can be devised without departing from the scope of the invention.

The invention claimed is:

1. An ultrasonic joining apparatus, comprising:
 a lead wire housing mechanism housing a lead wire that is wound therein, the lead wire being drawable outside the lead wire housing mechanism by drawing a tip end portion of the lead wire;
 a tension adjustment mechanism having a dancer roller which is movable up and down by applying predetermined pressure and performing a tension adjustment process on the lead wire with keeping a contact relationship between the dancer roller and the lead wire in an actual operation state;
 an ultrasonic joining head performing an ultrasonic joining process on the lead wire disposed on a substrate to join the lead wire to the substrate; and
 a controller configured to control the ultrasonic joining head, the lead wire housing mechanism, and the tension adjustment mechanism, wherein
 the lead wire housing mechanism can perform delivery driving of sending out the lead wire and rewinding driving of rewinding the lead wire,
 the tension adjustment mechanism can be set to any of a preparatory state and the actual operation state, the preparatory state being a state where the dancer roller is disposed in a position where the tension adjustment process cannot be performed, and the actual operation state being a state where the dancer roller is disposed in a position where the tension adjustment process can be performed,
 the controller controls the lead wire housing mechanism and the tension adjustment mechanism to perform a tension control process on the lead wire,
 the tension control process includes a joining tension control process performed in the ultrasonic joining process, the joining tension control process being performed to keep the dancer roller in a tension adjustment range in an up-down direction that is defined as a range between an upper limit adjustment position and a lower limit adjustment position, the upper limit adjustment position and the lower limit adjustment position being previously set, and
 the controller is further configured to, as the joining tension control process:
 (a) set the tension adjustment mechanism to the actual operation state to locate the dancer roller in the tension adjustment range;
 (b) control the lead wire housing mechanism to perform the rewinding driving so that the dancer roller is located within the tension adjustment range when the dancer roller reaches the lower limit adjustment position; and
 (c) control the lead wire housing mechanism to perform the delivery driving so that the dancer roller is located within the tension adjustment range when the dancer roller reaches the upper limit adjustment position.

2. The ultrasonic joining apparatus according to claim 1, wherein
 the tension control process includes previous tension control process performed prior to the ultrasonic joining process,
 the tension adjustment mechanism is set to the preparatory state in an initial state, and
 the controller is configured to, as the previous tension control process that is started from the initial state:
 (d) control the lead wire housing mechanism to perform the delivery driving so that the lead wire can be disposed in a lead set position on the substrate; and
 (e) after locating the lead wire in the lead set position, control the tension adjustment mechanism so that the tension adjustment mechanism is set to the actual operation state.

3. The ultrasonic joining apparatus according to claim 2, wherein
 the tension control process includes another tension control process performed when the controller determines that the lead wire is fractured, under a start condition that the controller detects that a position of the dancer roller reaches a lower limit position, the lower limit position being preset below the lower limit adjustment position of the tension adjustment range, and the preparatory state being a state where the dancer roller is disposed above the upper limit adjustment position of the tension adjustment range, and
 the controller is configured to, as the other tension control process:
 (f) control the tension adjustment mechanism so that the tension adjustment mechanism is set to the preparatory state again;

(g) control the lead wire housing mechanism to perform the delivery driving so that the lead wire can be disposed in the lead set position on the substrate again; and (h) after locating the lead wire in the lead set position again, control the tension adjustment mechanism so that the tension adjustment mechanism is set to the actual operation state again.

4. The ultrasonic joining apparatus according to claim 1, wherein the tension adjustment mechanism includes an air cylinder in which the dancer roller is attached to a tip end of a rod, and the air cylinder has a length measurement function capable of recognizing a cylinder stroke.

5. The ultrasonic joining apparatus according to claim 4, wherein the length measurement function of the air cylinder includes an electrical signal output function of outputting an electrical signal indicating the cylinder stroke.

6. The ultrasonic joining apparatus according to claim 1, wherein the delivery driving includes a speed setting function of performing variable setting of a lead wire delivery speed as a speed of sending out the lead wire.

* * * * *